United States Patent
Choi et al.

(12)

(10) Patent No.: US 6,284,438 B1
(45) Date of Patent: Sep. 4, 2001

(54) METHOD FOR MANUFACTURING A PHOTORESIST PATTERN DEFINING A SMALL OPENING AND METHOD FOR MANUFACTURING SEMICONDUCTOR DEVICE USING THE SAME

(75) Inventors: Sang-jun Choi, Seoul; Yool Kang, Sungnam; Si-hyeung Lee; Joo-tae Moon, both of Suwon, all of (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/420,555

(22) Filed: Oct. 19, 1999

(30) Foreign Application Priority Data

Oct. 30, 1998 (KR) .................................................. 98-46237

(51) Int. Cl.⁷ ...................................................... G03F 7/26
(52) U.S. Cl. ........................... 430/322; 430/311; 430/320; 430/326; 430/330
(58) Field of Search ................................... 430/322, 326, 430/330, 311, 320

(56) References Cited

U.S. PATENT DOCUMENTS

| 4,842,992 | * | 6/1989 | Arai ....................................... 430/328 |
| 5,856,411 | * | 1/1999 | Choi et al. ............................ 525/376 |
| 6,045,970 | * | 4/2000 | Choi .................................. 430/270.1 |

FOREIGN PATENT DOCUMENTS

825492 * 2/1998 (EP) .

OTHER PUBLICATIONS

"The Annealing Concept for Environmental Stabilization of Chemical Amplification Resists" Ito, H. et al, in Microelectronics Technology ACS Sym. Series 614, 1995, 21–34.*

* cited by examiner

*Primary Examiner*—Rosemary E. Ashton
(74) *Attorney, Agent, or Firm*—The Law Offices of Eugene M. Lee, P.L.L.C.

(57) ABSTRACT

A method for manufacturing a photoresist pattern that defines an opening having a small size, and a method for manufacturing a semiconductor device using the same are provided. A photoresist pattern defining the opening can be formed using a photoresist composition that includes either polymer mixture I containing a polymer A in which an acid-labile di-alkyl malonate group is pendant to the polymer backbone, and a polymer B in which a group that thermally decomposes at a temperature lower than the glass transition temperature of the polymer B itself is pendant to the polymer backbone, or polymer mixture II containing the polymer B and a polymer C including a (meth)acrylate as a monomer, as a main component. The size of the opening then can be reduced by thermal flowing the photoresist pattern. It is possible to form the photoresist pattern defining an opening having a small size since the photoresist composition comprises the polymer mixture which has advantageous characteristics, such as high contrast, and in which the flow rate of the composition upon thermal flowing can easily be controlled.

21 Claims, 3 Drawing Sheets

METHOD FOR MANUFACTURING A PHOTORESIST PATTERN DEFINING A SMALL OPENING AND METHOD FOR MANUFACTURING SEMICONDUCTOR DEVICE USING THE SAME

BACKGROUND OF THE INVENTION

1. Field of the Invention

The present invention relates to a method for manufacturing a semiconductor device, and more particularly, to a method for manufacturing a photoresist pattern defining an opening having a small critical dimension. The invention also relates to a semiconductor device prepared by the aforementioned method.

2. Description of the Related Art

Semiconductor manufacturing processes have become more complicated, and the integration degree of a semiconductor chip has increased to more than 1 Giga bit DRAM. It has therefore become necessary to form minute patterns according to a design rule of less than 0.25 $\mu$m. These minute patterns have recently been formed using a deep-UV (248 nm) light, which has a shorter wavelength than conventional g-line (436 nm) and i-line (365 nm) light, as a light source in the semiconductor manufacturing processes. In addition, half-tone phase shift masks now are being used as the photomask in semiconductor manufacturing processes instead of the conventional light-shielding pattern masks, such as binary chrome masks. The conventional light sources having longer wavelengths (e.g., g-line or i-line) or photoresist materials that are used for the binary chrome mask typically exhibit a low contrast when they are used in a photolithography process, which uses the deep-UV light source and the half-tone phase shift mask. It has therefore not been heretofore possible to form a photoresist pattern defining an opening having a small critical dimension (i.e., small size) to have a desired profile.

In another method for forming a minute pattern, the size of the opening defined by the photoresist pattern can be reduced by thermally flowing the photoresist pattern after forming it. In this thermal flowing method, care should be taken to minimize the variation of the critical dimension (i.e., size, diameter, circumference, etc.) of the photoresist pattern according to changes in temperature. In particular, care should be taken to minimize the variation of the critical dimension due to differences of flow rates according to the shape and position of the opening. Accordingly, photoresists suitable for use in this thermal flowing method are those whose flow rate, i.e., flow amount per unit temperature (nm/° C.), is small such that the flow rate can be easily controlled. Conventional photoresists, however, exhibit a high flow rate (nm/° C.) so that controlling the flow rate of the photoresist is difficult.

SUMMARY OF THE INVENTION

It is a feature of the present invention to provide a method for manufacturing a photoresist pattern defining an opening having a small size using a photoresist component having a large contrast and whose flow rate is easily controlled. It is another feature of the present invention to provide a method for manufacturing a highly integrated semiconductor device using the above method for manufacturing the photoresist pattern.

In accordance with these and other features of the invention, there is provided a method for manufacturing a photoresist pattern including:

providing a semiconductor substrate;

forming a material film to be patterned on the semiconductor substrate;

forming a photoresist film on the material film by coating thereon a photoresist composition including: (i) either a polymer mixture I containing a polymer A in which an acid-labile di-alkyl malonate group is pendant to the polymer backbone, and a polymer B in which a group that thermally decomposes at a temperature lower than the glass transition temperature of the polymer B itself is pendant to the polymer backbone, or a polymer mixture II containing the polymer B and a polymer C including acid-labile (meth)acrylate as a monomer; and (ii) a photosensitive acid generator;

forming a photoresist pattern defining an opening by patterning the photoresist film; and reducing the size of the opening performing a thermal flow process on the photoresist pattern.

In accordance with an additional feature of the present invention, there is provided a method for manufacturing a semiconductor device having a contact hole or a damascene area of a small critical dimension (e.g., small size) by patterning an underlayer using the photoresist pattern manufactured by the above-mentioned method for manufacturing the photoresist pattern. The method for manufacturing the semiconductor device encompasses:

providing a semiconductor substrate;

forming a material film to be patterned on the semiconductor substrate;

forming a photoresist film on the material film by coating thereon a photoresist composition comprising: (i) either a polymer mixture I containing a polymer A in which an acid-labile di-alkyl malonate group is pendant to the polymer backbone and a polymer B in which a group that thermally decomposes at a temperature lower than the glass transition temperature of the polymer B itself is pendant to the polymer backbone, or a polymer mixture II containing the polymer B and a polymer C including acid-labile (meth)acrylate as a monomer; and (ii) a photosensitive acid generator;

forming a photoresist pattern defining an opening by patterning the photoresist film;

reducing the size of the opening by performing a first thermal flow process on the photoresist pattern; and etching the material film using the photoresist pattern as a mask to form either a contact hole or a damascene in the material film, whereby the contact hole or the damascene area have the size of the opening in the photoresist pattern.

In accordance with another feature of the invention, there is provided a semiconductor device having a contact hole or a damascene area prepared by the above-mentioned method.

According to the present invention, it is possible to easily form a photoresist pattern defining an opening having a small size. It is possible to form a contact hole or a damascene area having a small size using the photoresist pattern. Therefore, it is possible to increase the degree of integration of the semiconductor device.

BRIEF DESCRIPTION OF THE DRAWINGS

The above features and advantages of the present invention will become more apparent by describing in detail a preferred embodiment thereof with reference to the attached drawings in which.

DETAILED DESCRIPTION OF THE PREFERRED EMBODIMENT

Korean patent application No. 98-46237 filed on Oct. 30, 1998 and entitled "Method for Manufacturing Photoresist Pattern For Defining Opening Of Small Critical Dimension and Method for Manufacturing Semiconductor Device Using the Same" is incorporated by reference herein in its entirety. Hereinafter, a photoresist composition, preferably a chemically amplified composition, used for a method for manufacturing a photoresist pattern according to the present invention, and a method for manufacturing a photoresist pattern will be described. Then, a method for manufacturing a photoresist pattern using the photoresist composition and a method for manufacturing a semiconductor device will be described. A semiconductor device prepared in accordance with this method also will be described. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The present invention provides a method for manufacturing a photoresist pattern including:

providing a semiconductor substrate;

forming a material film to be patterned on the semiconductor substrate;

forming a photoresist film on the material film by coating thereon a photoresist composition including: (i) either a polymer mixture I containing a polymer A in which an acid-labile di-alkyl malonate group is pendant to the polymer backbone, and a polymer B in which a group that thermally decomposes at a temperature lower than the glass transition temperature of the mixture is pendant to the polymer backbone, or a polymer mixture II containing the polymer B and a polymer C including acid-labile (meth)acrylate as a monomer; and (ii) a photosensitive acid generator;

forming a photoresist pattern defining an opening by patterning the photoresist film; and reducing the size of the opening by performing a thermal flow process on the photoresist pattern.

The step of forming the photoresist pattern is preferably performed using a half tone phase shift mask. The step of flowing the photoresist pattern preferably is performed at a temperature higher than the glass transition temperature or softening temperature of the polymer mixture I or II. Preferably, the size of the opening that is formed is further reduced by cooling the semiconductor substrate after the first thermal flowing step and initiating a second thermal flow process. The cooling and thermal flowing processes may be repeated if necessary after the second thermal flow process to further reduce the size of the opening.

The acid-labile di-alkyl malonate group that is pendant to the backbone of polymer A preferably is a di-t-butyl malonate or di-tetrahydropyranyl malonate. The group pendant to the backbone of polymer B, which thermally decomposes at a temperature lower than the glass transition temperature of the polymer B itself so as to increase the interactions among the molecules, preferably is a t-butoxycarbonyloxy, tetrahydropyranyloxy, or $C_1$ to $C_{10}$ alkoxy-1-ethoxy.

The polymer A and polymer B preferably are present in polymer mixture I in a weight ratio of from 1:9 to 5:5. The polymer B and polymer C preferably are present in polymer mixture II in a weight ratio of from 5:5 to 9:1.

Throughout this description, the expression, "small critical dimension" denotes a dimension of an opening in a photoresist pattern that is small in comparison to the openings of conventional openings extant at the time. Preferably, "dimension" denotes width, diameter, radius, circumference or area of the opening, and most preferably, the dimension is the width of the opening. Most preferably, the width of the opening is less than 0.25 μm, preferably less than 0.22 μm, and even more preferably, less than 0.20 μm.

The photosensitive acid generator can be mixed at from 1 to 15 weight percent based on the total weight of the polymer mixture I or the polymer mixture II. Preferably, the photoresist composition further comprises an organic base, for example, an amine derivative. In particular, it is preferable that the photoresist composition further comprise an organic base ranging from 0.01 to 2.0 weight percent based on the total weight of the polymer mixture.

The photoresist composition used in the method for manufacturing the photoresist pattern according to the present invention includes: (i) the polymer mixture I or the polymer mixture II; and (ii) the photosensitive acid generator. The polymer mixture I contains the polymer A in which an acid-labile di-alkyl malonate group is pendant to the polymer backbone and a polymer B in which a group that thermally decomposes at a temperature lower than the glass transition temperature of the polymer B itself so as to increase interactions among molecules, is pendant to the polymer backbone.

Preferably, the polymer A is a copolymer represented by Chemical formula 1, and the polymer B is a copolymer represented by Chemical formula 2.

CHEMICAL FORMULA 1

CHEMICAL FORMULA 2 wherein, $R_1$ is a t-butyl or tetrahydropyranyl group, $R_2$ and $R_3$ are each independently a hydrogen atom or a methyl group, $R_4$ is a $C_1$ to $C_{10}$ alkoxy-1-ethyl, tetrahydropyranyl, or t-butoxycarbonyl group, m, n, x, and y are integers, the ratio of m/(m+n) is from 0.1 through 0.5, and the ratio of y/(x+y) is from 0.1 through 0.5. The weight average molecular weight of the respective polymers preferably ranges from 5,000 to 100,000, more preferably from about 7,500 to about 50,000, and most preferably, from about 9,500 to about 25,000.

The polymer mixture II contains the polymer B and a polymer C, which includes an acid-labile (meth)acrylate as a monomer. The polymer B and the polymer C preferably are mixed in a ratio of from 5:5 to 9:1.

Preferably, the polymer B is the copolymer represented by Chemical formula 2, and the polymer C is the copolymer represented by Chemical formula 3.

CHEMICAL FORMULA 2

CHEMICAL FORMULA 3 wherein, $R_4$ is a $C_1$ to $C_{10}$ alkoxy-1-ethyl, tetrahydropyranyl, or t-butoxycarbonyl group, $R_5$ is a hydrogen atom or methyl group, $R_6$ is a t-butyl or tetrahydropyranyl group, x, y, p, and q are integers, the ratio of y/(x+y) is from 0.1 to 0.5, and the ratio of q/(q+p) is from 0.1 to 0.5. The weight average molecular weight of the respective polymers preferably ranges from 5,000 to 100,000, more preferably from about 7,500 to about 50,000, and most preferably, from about 9,500 to about 25,000.

In the polymer mixture I or II, the polymer A and the polymer C usually show high contrast. Therefore, they are suitable for a photolithography process in which a half tone phase shift mask is used. The polymer B makes it easy to control the flow rate during the thermal flow.

The photosensitive acid generator completes the photoresist composition, and is preferably present in an amount of from 1 to 15 weight percent based on the total weight of the polymer mixture I or II. Any photosensitive acid generator can be used in the composition of the invention so long as it is capable of generating and acid group upon activation with light. Preferably, triarylsulfonium salts, diaryliodonium salts, or sulfonates are used as the photosensitive acid generator. Skilled artisans are capable of selecting a suitable photosensitive acid generator given the guidelines provided herein.

Preferably, the photoresist composition according to the present invention further includes an organic base present in an amount ranging from 0.01 to 2.0 weight percent based on the total weight of the polymer mixture. Triethylamine, triisobutylamine, diethanolamine, or triethanolamine preferably are used as the organic base. The organic base can prevent a decrease in a critical size of the pattern after exposure, which may be caused by acid diffusing from an exposed portion to an unexposed portion.

The above photoresist composition preferably is prepared as follows.

Preparation of the Photoresist Composition

1. Preparation of the Polymer A 1-1. Preparation of the Monomer

As shown in the following reaction sequence 1, after dissolving di-alkyl malonate (I) in an organic solvent such as tetrahydrofuran (THF) in which sodium hydride has been dissolved, chloromethyl styrene (II) is added to the solution, and then di-alkyl malonyl styrene (III) is obtained through a substitution reaction.

REACTION SEQUENCE 1

In the above formula, $R_1$ can be a t-butyl or tetrahydropyranyl group.

1-2. Preparation of Polymer A

The polymerization proceeds as shown in reaction sequence 2.

REACTION SEQUENCE 2

-continued (V)

wherein, $R_1$ is a t-butyl or tetrahydropyranyl group, $R_2$ and $R_3$ are each independently a hydrogen atom or a methyl group, m and n are integers, and the ratio of m/(m+n) is from 0.1 to 0.5. In the polymerization process, the monomer III and acetoxystyrene derivative (IV) are dissolved in an organic solvent such as toluene, and a polymerization initiator such as azobisisobutyronitrile (AIBN) is added to obtain a copolymer (V) through polymerization.

Then, as shown in reaction sequence 3, the copolymer (V) is deacetylated using an organic base, resulting in copolymer A having a weight average molecular weight ranging from 5,000 to 100,000 and to which the acid-labile di-alkyl malonate is pendant. Here, ammonium hydroxide or hydrazine can be used as the organic base. Those skilled in the art are capable of synthesizing monomer (III) and polymerizing it with acetoxystyrene derivatives (IV) to make copolymer (V), and then deacetylating copolymer (V) to produce copolymer A, using the guidelines provided herein.

REACTION SEQUENCE 3

2. Preparation of Polymer B

As shown in the following reaction sequence 4, the copolymer B, to which an alkyl ($R_4$) group that can thermally decompose at a temperature lower than the glass transition temperature of the polymer B itself is pendant, and having a weight average molecular weight of from 5,000 through 100,000 is prepared by reacting poly (hydroxystyrene) (VI) and a material (VII) which can incorporate alkyl group ($R_4$) into the polymer.

REACTION SEQUENCE 4 wherein, $R_4$ represents a $C_1$ to $C_{10}$ alkoxy-1-ethyl, tetrahydropyranyl, or t-butoxycarbonyl group, X represents a reactive atom which can react with an oxygen atom or a hydroxy group, x and y are the integers, and the ratio of y/(x+y) is from 0.1 to 0.5. Skilled artisans are capable of synthesizing various copolymer B components by reacting alkyl group ($R_4$) containing compounds with poly (hydroxystyrene) (VI), using the guidelines provided herein.

3. Preparation of Polymer C

The copolymer (X) can be prepared by polymerization after dissolving acetoxystyrene (VIII) and (meth)acrylate (IX) in an organic solvent, and then adding a polymerization initiator, as shown in the reaction sequence 5.

REACTION SEQUENCE 5

-continued (X)

wherein, $R_5$ is a hydrogen atom or the methyl group, $R_6$ is a t-butyl or tetrahydropyranyl group, p and q are integers, and the ratio of q/(p+q) is from 0.1 to 0.5.

The copolymer C having a weight average molecular weight ranging from 5,000 to 15 100,000, and including the acid-labile (meth)acrylate as the monomer, can be prepared by adding an organic base to the copolymer (X) to deacetylize the copolymer (X), as shown in reaction sequence 6. Those having ordinary skill in the art are capable of synthesizing copolymer C using the guidelines provided herein.

REACTION SEQUENCE 6

4. Preparation of Photoresist Composition

The polymer mixture I, in which the polymer A and the polymer B, manufactured by the above manufacturing methods, are mixed in a ratio of from 1:9 to 5:5, or the polymer mixture II, in which the polymer B and the polymer C are mixed in a ratio of from 5:5 to 9:1 is dissolved in an appropriate solvent. Any solvent can be used to dissolve either polymer mixture I or II. It also is possible to form a combined polymer mixture that contains polymer A, polymer B and polymer C. Skilled artisans are capable of selecting a suitable solvent to dissolve either polymer mixture.

The photoresist composition then can be prepared by adding at least one photosensitive acid generator in an amount ranging from 1 to 15 weight percent based on the total weight of the polymer mixture I or II, to the solvent. The triarylsulfonium salts, diaryliodonium salts, or the sulfonates, which are thermally stable, are preferably used as the photosensitive acid generator.

Triphenylsulfonium triflate or triphenyl sulfonium antimonate can be used as the triarylsulfonium salts. Diphenyliodonium triflate, diphenylidonium antimonate, methoxydiphenyliodonium triflate, or di-t-butyldiphenyliodonium triflate can be used as the diaryl iodonium salts. 2,6-dinitro benzyl sulfonate or pyrogallol tris(alkyl-sulfonates) can be used as the sulfonates. Combinations of these photosensitive acid generators also can be used in the present invention.

Also, it is preferable to complete the photoresist composition by further adding at least one organic base in an amount ranging from 0.01 to 2.0 weight percent based on the total weight of the polymer mixture I or II. Triethylamine, triisobutylamine, diethanolamine, triethanolamine, or mixtures thereof, are preferably used as the organic base.

Fabrication Method of Photoresist Pattern

The method of forming the photoresist pattern that defines an opening having a small critical dimension (i.e., small size) using the photoresist composition prepared according to the above method will be described with reference to FIGS. 1 through 4.

Figure 1:
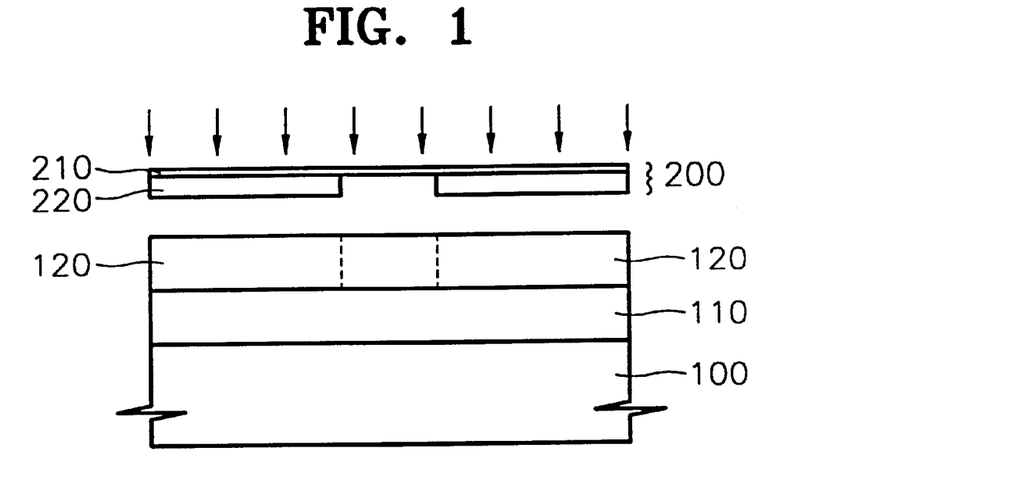
FIGS. 1 through 4 are sectional views for describing a method for manufacturing a photoresist pattern defining an opening having a small size according to an embodiment of the present invention.

Referring to FIG. 1, a material film 110 to be patterned can be formed on a semiconductor substrate 100. Any method can be used to form the material film 110 on semiconductor substrate 100, and skilled artisans are capable of using any of these methods to form the material film 110. A photoresist film 120 then can be formed by coating the photoresist composition that contains the polymer mixture I or the polymer mixture II, the photosensitive acid generator and, optionally, the organic base, on the material film 110. Those skilled in the art are familiar with the myriad coating techniques, and are capable of coating a suitable photoresist composition to form photoresist film 120 using the guidelines provided herein.

Then, the photoresist film typically is pre-baked. After pre-baking the photoresist film, the photoresist film 120 then can be exposed using a phase shift mask 200 in which a half tone phase shift pattern 220 is formed on a mask substrate 210.

Acid is generated by the photosensitive acid generator of the photoresist film by the exposure. Then, the acid-labile di-alkylmalonate group of the polymer A in the exposed portion is acidolysed to malonic acid, or the (meth)acrylate of the polymer C is acidolysed to (meth)acrylic acid by a catalytic reaction of the acid, depending on whether polymer mixture I or II is used. At this time, polymer B also is acidolysed by the acid which acts as a catalyst to form the hydroxy analog of polymer B. Therefore, since the exposed portion of the photoresist film includes a large amount of malonic acid, (meth)acrylic acid, and hydroxy groups, the solubility is higher than the unexposed portion. That is to say, the contrast increases remarkably.

The acidolysis mechanism of the polymers A, B, and C are shown in reaction sequence 7.

REACTION SEQUENCE 7

REACTION SEQUENCE 8

Figure 2:
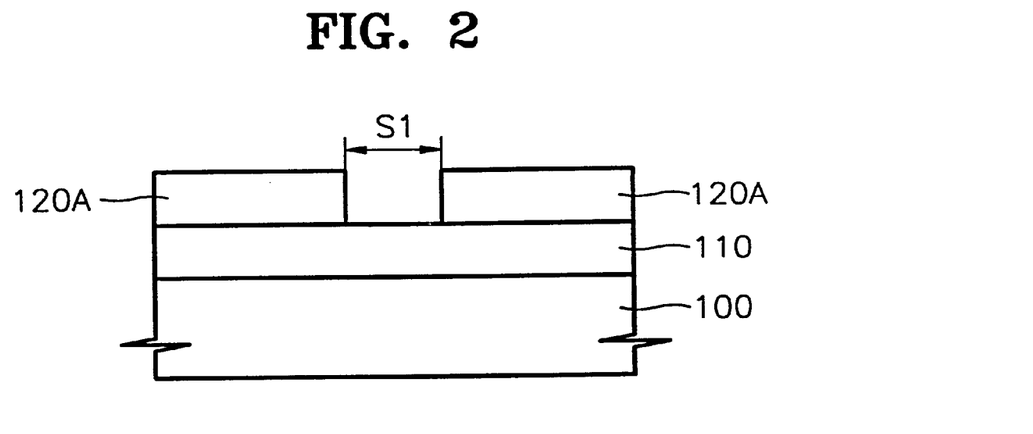

Referring now to FIG. 2, after the exposure is complete, the photoresist film is post-exposure baked for a short time before development. The post-exposure bake is performed in order to activate the acidolysis reaction by the acid catalyst in the exposed portion. Then, a first photoresist pattern 120A defining an opening of a first size (S1) can be formed by performing a developing process using an appropriate developer. Using the guidelines provided herein, those skilled in the art are capable of selecting an appropriate developer and performing a developing process to complete the photoresist pattern 120A.

Figure 3:
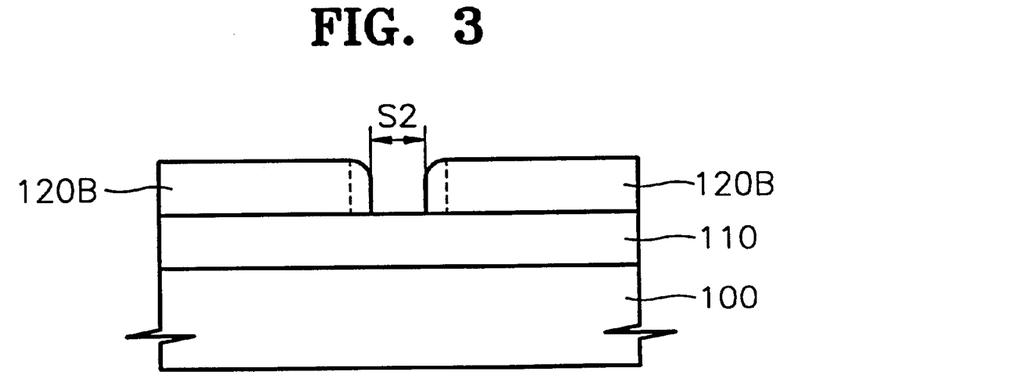

Referring now to FIG. 3, a second photoresist pattern 120B for defining the opening of a second size S2 smaller than the first size S1 can be formed by performing a thermal flow process on the first photoresist pattern 120A. The thermal flow process is performed for 60 to 120 seconds at a temperature higher than the glass transition temperature or the softening temperature of the polymer mixture I or II.

At this time, the reaction shown in reaction sequence 8 occurs in the polymer B.

Namely, since the group that thermally decomposes at a temperature lower than the glass transition temperature of the polymer B itself so as to increase the interactions among molecules, such as a t-butoxycarbonyloxy, tetrahydropyranyloxy or $C_1$ to $C_{10}$ alkoxy-1-ethoxy group, which is pendant to the backbone of the polymer B, is thermally decomposed during the thermal flow process, a hydroxy group is thereby formed by the decomposed group. The hydroxy group increases the interactions among the molecules and thereby reduces the flow rate (nm/° C.) of the photoresist pattern. Therefore, it is possible to minimize the transformation of the pattern due to differences in the flow rates between a top portion and a bottom portion of the photoresist pattern, in accordance with changes in the temperature between these portions. Therefore, it is possible to form a pattern having a vertical profile.

Figure 4:
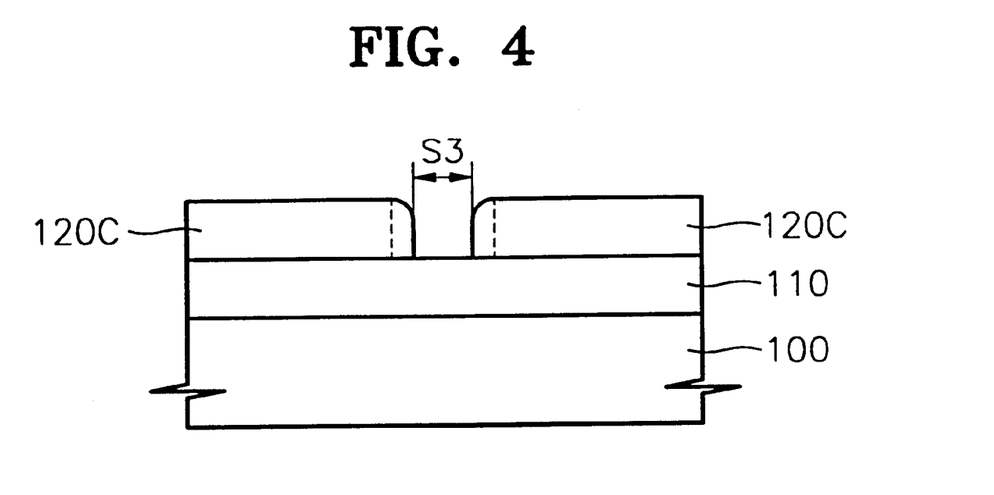

As shown in FIG. 4, a second thermal flow process can be performed on the second photoresist pattern 120B after cooling the semiconductor substrate in which the second photoresist pattern 120B is formed. The substrate is cooled to room temperature. The second thermal flow process then preferably is performed at a higher temperature than in the first thermal flow process. Preferably, the second thermal flow process is performed at a temperature 10° C. to 30° C. higher than the temperature of the first thermal flow process for 60 to 180 seconds. As a result, a third photoresist pattern 120C for defining an opening of a third size (S3) smaller than the second size (S2) is formed.

The thermal flow process is performed twice in the present embodiment. However, the number of thermal flow processes can be controlled according to the size of the opening to be formed. Namely, if it is sufficient to perform the thermal flow process only once, the processes to FIG. 3 are performed. If it is necessary to further reduce the size of the opening to less than S3, it is possible to further perform the cooling and thermal flow processes after the process of FIG. 4. For example, when a third thermal process is performed after the second thermal flow process, it is preferable to perform the third thermal process at a temperature 2° C. to 10° C. higher than the temperature of the second thermal process. Skilled artisans are capable of fashioning the thermal flow process (temperature and number of times) to tailor the size of the opening, using the guidelines provided herein.

Figure 5A:
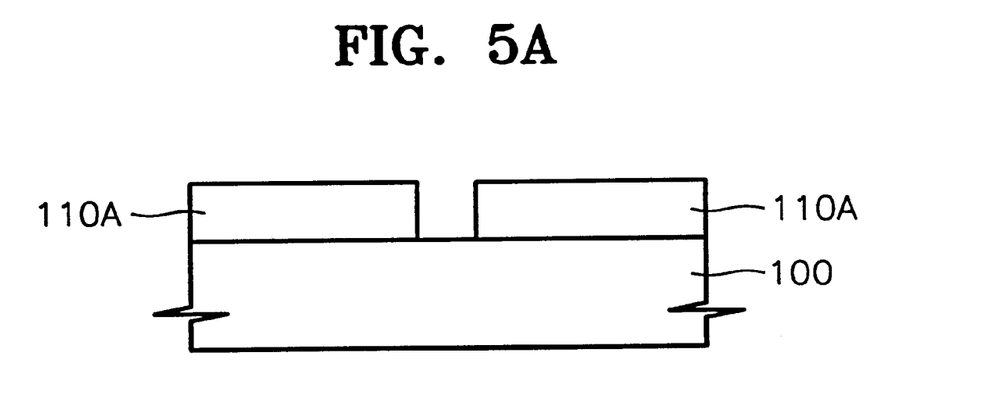
FIGS. 5A and 5B are sectional views showing the result of patterning a material film using the photoresist pattern manufactured according to the present invention.
Figure 5B:
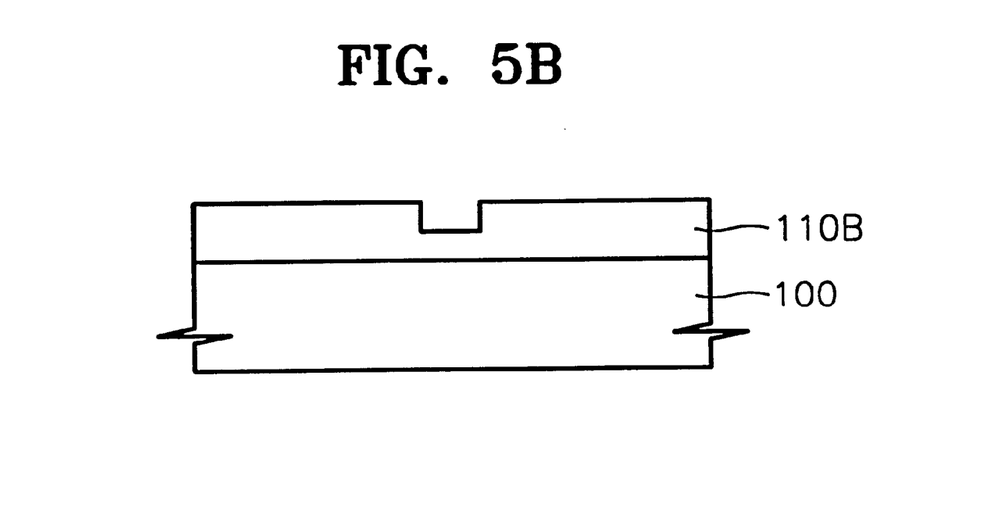

The semiconductor device can be manufactured by patterning the material film 110 using the photoresist pattern 120B or 120C, thus forming a material film pattern 110A through which a contact hole having a small critical dimension (small size such as a small width) is formed as shown in FIG. 5A, or forming another material film pattern 110B in which a damascene area having a small critical dimension (small size such as small width) is formed by etching only some of the material film 110 as shown in FIG. 5B. The size of the contact hole or the damascene area is determined by the size of the opening in the photoresist film, and preferably the size of the contact hole or the damascene area is the same (e.g., substantially the same) as the size of the opening.

Hereinafter, examples of preparing a polymer mixture used for the photoresist pattern manufacturing method according to the present invention and photoresist composition containing the polymer mixture and examples of forming the photoresist pattern using the same will be described. However, the present invention is not limited to the following examples.

EXAMPLE 1
Preparation of di-t-butylmalonylmethyl Styrene

Sodium hydride (4.8 g; 0.12 mol) was dissolved in THF (250 mL) and reacted for about one hour after slowly dropping in 25 g (0.11 mol) of di-t-butyl malonate. Then, the mixture was reacted for about 12 hours at room temperature after slowly dropping in chloromethylstyrene (0.1 mol) at 0° C. After the substitution reaction was completed, the reactant was extracted using diethyl ether after dissolving the reactant in an excess amount of water and neutralizing with hydrochloric acid. After drying the obtained precipitant using magnesium sulfate, a reaction product was separated using a column chromatography (yield 65%).

Nuclear Magnetic Resonance and Fourier Transform Infrared Radiation (FT-IR) spectroscopy analyses were performed on the obtained di-t-butylmalonylmethyl styrene, and the results were as follows: $^1$H-NMR(CDCl3)(ppm): 1.4(s, 18H), 3.1(d, 2H), 3.5(t, 1H), 5.2(dd, 1H), 5.7(dd, 1H), 6.6(dd, 1H), and 7.2(m, 4H). FT-IR(NaCl)(cm$^{-1}$): 2978(C—H, t-butyl), 1727(C=O), 1369, 1140, and 847.

EXAMPLE 2
Preparation of Poly(di-t-butylmalonylmethyl styrene-acetoxystyrene)

Di-t-butylmalonylmethyl styrene (3 g; 9 mmol) and 4.5 g (27 mmol) of acetoxystyrene were dissolved in toluene (35 mL). After adding 0.35 g of AIBN thereto and purging for about one hour using a nitrogen gas, polymerization was performed at 70° C. for about 24 hours.

After the polymerization reaction, the reaction product was separated by precipitating the reactant in an excessive amount of n-hexane (about 10 times) and drying the precipitant in a vacuum oven maintained at about 50° C. for about 24 hours (yield 70%).

The weight average molecular weight of the obtained copolymer reaction product was 11,157 and the polydispersity was 1.6. The FT-IR analysis result was as follows.

FT-IR(DBr)(cm$^{-1}$): 2979(C—H, t-butyl), 1767(C=O, acetyl), 1727(C=O, malonyl), 1369, and 1216

EXAMPLE 3
Preparation of Poly(di-t-butylmalonylmethyl styrene-hydroxystyrene)

The deacetylation reaction proceeded by refluxing 10 g of the copolymer reaction product prepared in accordance with example 2 in a mixture solution of ammonium hydroxide (28% solution, 10 mL) and methanol (50 mL). Then, the reactant was slowly precipitated using an excess amount of water.

After dissolving the precipitant in THF, and then reprecipitating it in an excess amount of n-hexane, the reaction product was separated by drying the precipitant in a vacuum oven maintained at about 50° C. (yield 90%). The weight average molecular weight of the obtained reaction product was 9438, and it had a polydispersity of 1.6. The FT-IR analysis result was as follows.

FT-IR(KBr)(cm$^{-1}$): 3440(O—H), 2980(C—H, t-butyl), 1728(C=O), 1513, 1369, and 1145.

EXAMPLE 4
Preparation of Poly(hydroxy styrene-t-butyl methacrylate)

Tert-butyl methacrylate (5.7 g; 40 mmol) and 9.7 g (60 mmol) of acetoxystyrene were dissolved in toluene (80 mL). The reaction product was separated by the same method as that described in example 2, except that 0.67 g of AIBN was added.

Then, the reaction product was obtained by performing the deacetylation reaction by the same method as that described in example 3 (yield 70%).

EXAMPLE 5
Preparation of Poly (t-butoxycarbonyloxystyrene-hydroxystyrene)

Poly (hydroxystyrene) (12 g) and 4 g of pyridine were dissolved in THF (70 mL), and then 11 g of di-t-butyl dicarbonate were added. The mixture then was reacted at about 40° C. for 12 hours. After completion of the reaction, the reactant was slowly dropped into an excessive amount of water and was neutralized using hydrochloric acid. After filtering the precipitant using a glass-filter, the precipitant was dissolved in THF. Then, the reaction product was separated by re-precipitating the resultant product in an excess amount of n-hexane and drying the precipitant in a vacuum oven maintained at about 50° C. (yield 85%).

EXAMPLE 6
Preparation of Photoresist Pattern for Defining an Opening of 0.25 µm A polymer mixture was obtained by mixing 0.3 g of poly(di-t-butylmalonylmethyl styrene-hydroxystyrene) (weight average molecular weight of 11,400) prepared in accordance with example 3, with 0.7 g of poly(t-butoxycarbonyloxystyrene-hydroxystyrene) prepared in accordance with example 5, and 0.04 g of triphenyl sulfonium triflate as the photosensitive acid generator in 6.0 g of propylene glycol monomethyl ether acetate. After placing 2 mg of triethanolamine into the resultant mixture and completely dissolving it, the mixture was sufficiently stirred. Then, the photoresist composition was obtained by filtering the mixture using a 0.2 µm filter.

The obtained photoresist composition was coated to a thickness of about 0.5 µm on a wafer onto which the material film will be patterned. The wafer on which the photoresist composition was coated was soft baked at a temperature of about 110° C. for about 90 seconds. Then, the resultant soft baked wafer having the photoresist composition coated thereon was exposed with a dose of 55 mJ/cm$^2$ using a half tone phase shift mask for defining an opening pattern of 0.30 µm and a KrF excimer laser having a numerical aperture (NA) of 0.6, and then it was post-baked at a temperature of 110° C. for about 90 seconds.

Then, the photoresist pattern for defining the opening of 0.30 µm was formed by developing the exposed and post-baked wafer using 2.38 weight percent of tetramethylammonium hydroxide for 60 seconds. A thermal flow process then was performed on the photoresist pattern in order to reduce the size (diameter) of the opening. The thermal flow process was performed at a temperature of 155° C. for 120 seconds. The second photoresist pattern formed as a result of the thermal flow defined an opening having a width of 0.25 µm.

EXAMPLE 7
Fabrication of Photoresist Pattern Defining an Opening of 0.22 µm

The first thermal flow process was conducted in order to reduce the size of the opening after performing the initial process of manufacturing the photoresist pattern for defining an opening of 0.30 µm according to the same method as that described in example 6. A first thermal flow process was performed at a temperature of 130° C. for 120 seconds. Then, after cooling the wafer to room temperature, a second thermal flow process was performed at 155° C. for 120 seconds. As a result, a photoresist pattern defining an opening having a width of 0.22 µm was formed.

EXAMPLE 8
Fabrication of Photoresist Pattern Defining an Opening of 0.20 µm

The first thermal flow process was conducted in order to reduce the size of the opening after performing the initial process of manufacturing the photoresist pattern for defining the opening of 0.30 µm according to the same method as that described in example 6. A first thermal flow process was performed at a temperature of 125° C. for 120 seconds. Then, after cooling the wafer, a second thermal flow process was performed at 145° C. for 120 seconds. After cooling the wafer, a third thermal flow process was performed at 155° C. for 120 seconds. As a result, a photoresist pattern defining an opening having a width of 0.20 µm was formed.

EXAMPLE 9
Fabrication of Photoresist Pattern Defining an Opening of 0.25 µm

A photoresist pattern defining an opening of 0.25 µm was formed by performing the same processes as those described in example 6, except that 0.3 g of poly(hydroxystyrene-t-butyl methacrylate) (weight average molecular weight of 12,500) prepared in example 3, and 0.7 g of poly(t-butoxycarbonyloxystyrene-hydroxystyrene) prepared in example 5 (weight average molecular weight of 12,700) were used as the polymer mixture.

EXAMPLE 10
Measuring the Contrast of Photoresist Component

The contrast curve of a photoresist composition according to the present invention was measured as follows. After preparing the photoresist composition by mixing poly(di-t-butylmalonylmethyl styrene-hydroxystyrene) with a photosensitive acid generator, a photoresist film was formed on the substrate by coating the same on the substrate. The thickness of the photoresist film remaining in the exposed portion was determined and varied after exposing the photoresist film while varying the dose of exposing energy and developing the photoresist film. Then, the thickness of the initially coated photoresist film was converted into 1 µm, to calculate the normalized thickness (µm) of the photoresist film remaining in the exposed portion. The results are shown in FIG. 6.

Figure 6:
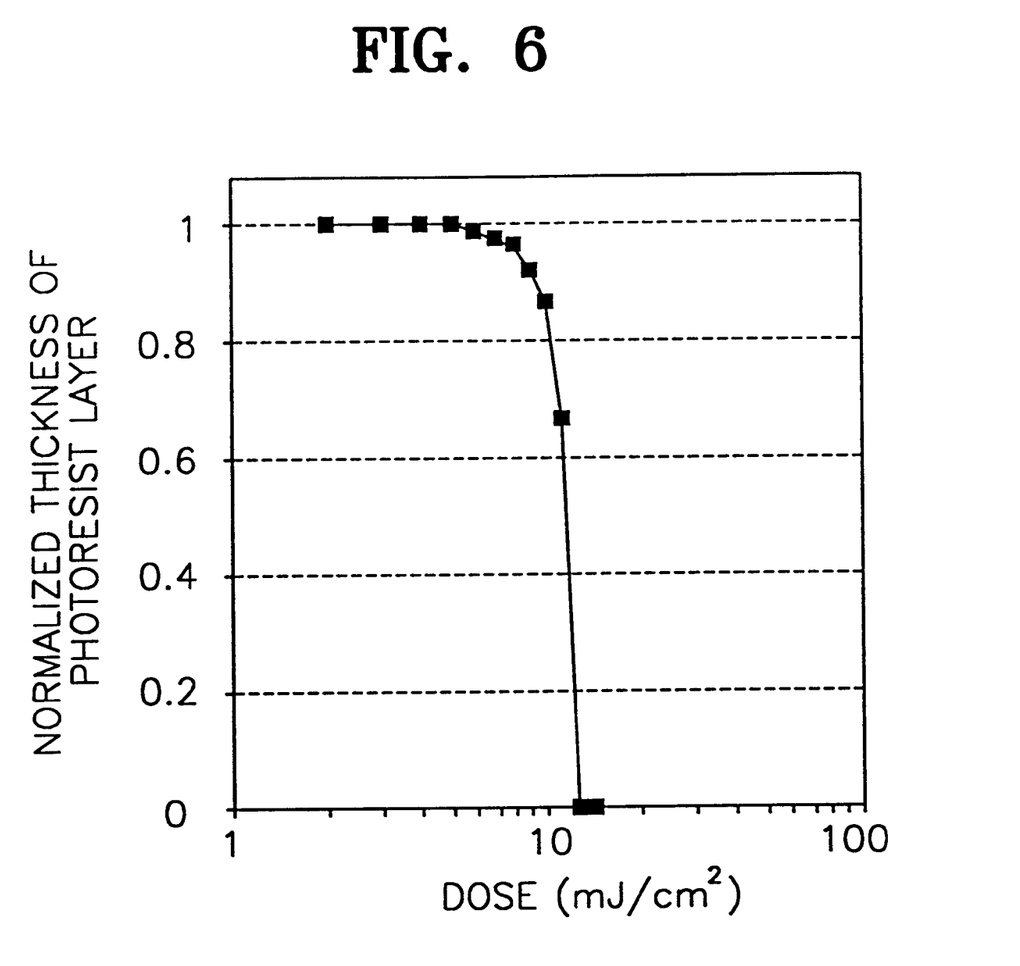
FIG. 6 is a graph showing the contrast curve of a photoresist film using poly (di-t-butylmalonylmethylstyrene-hydroxy styrene) as a main component.

As shown in FIG. 6, the normalized thickness is maintained to have a value of almost 1 at a dose of no more than 10 (mJ/cm$^2$) and was rapidly reduced to 0 at a specific dose no less than 10 (mJ/cm$^2$). Namely, the contrast curve showed a steep slope at the specific dose of about 10 (mJ/cm$^2$). This shows that the contrast of the photoresist composition according to the present invention is very high.

In the photoresist pattern manufacturing method according to the present invention, the photoresist composition including the polymer mixture I or the polymer mixture II is used. In the polymer mixture I, the polymer A contains an acid-labile di-alkyl malonate group which is pendant to the polymer backbone. The acid-labile di-alkyl malonate group is very bulky. It is acidolysed into the malonic acid by the acid generated from the photosensitive acid generator by the exposure. Therefore, the difference of solubilities of the photoresist formed of the polymer mixture I before and after the exposure, i.e., the contrast, remarkably increases. The polymer C of the polymer mixture II also contains acid-labile (meth)acrylate as the monomer. Namely, the (meth)acrylate including the t-butyl or tetrahydropyranyl group as a substituent is acidolysed into the (meth)acrylic acid by the acid generated from the photosensitive acid generator by the exposure. Therefore, the difference in solubilities of the photoresist formed of the polymer mixture II before and after the exposure is great, i.e., the contrast increases remarkably. The remarkably high contrast means that it is possible to minimize damage to the photoresist pattern by a side-lobe effect which can be generated when a half tone phase shift mask is applied.

The polymer B commonly included in the polymer mixtures I and II contains the group that is thermally decomposed at a temperature lower than the glass transition temperature of the polymer B itself, such as the t-butoxycarbonyloxy, tetrahydropyranyloxy, or $C_1$ to $C_{10}$ alkoxy-1-ethoxy. These groups are thermally decomposed during the thermal flow process and form the hydroxy groups. The hydroxy groups cause interactions among the molecules and reduce the flow rate (nm/(C) of the photoresist film. Therefore, since the flow of the photoresist film according to the change of temperature occurs slowly, it is possible to minimize the transformation of the pattern profile.

Therefore, it is possible to define an opening having a smaller width than in a case where a conventional mask is used if the photoresist pattern defining the opening is formed by forming the photoresist film using a photoresist composition including the polymer mixture I or II according to the present invention, and then preferably exposing the photoresist film using a half tone phase shift mask. Then, when a thermal flow process is performed on the photoresist pattern, it is possible to remarkably reduce the size (width) of the opening to no more than the resolution limit. Therefore, it is possible to easily form a highly integrated device of more than 1 Giga bit DRAM using the method for manufacturing the photoresist pattern according to the present invention.

While the invention has been described in detail by reference to particularly preferred embodiments and examples, those skilled in the art will appreciate that various modifications can be made to the present invention without significantly departing from the spirit and scope thereof.

What is claimed is:

1. A method for manufacturing a photoresist pattern, comprising:
   providing a semiconductor substrate;
   forming a material film to be patterned on the semiconductor substrate;
   forming a photoresist film on the material film by coating thereon a photoresist composition comprising: (i) either a polymer mixture I containing a polymer A in which an acid-labile di-alkyl malonate group is pendant to the polymer backbone and a polymer B in which a group that thermally decomposes at a temperature lower than the glass transition temperature of the polymer B itself is pendant to the polymer backbone, or a polymer mixture II containing the polymer B and a polymer C including (meth)acrylate as a monomer; and (ii) a photosensitive acid generator;
   forming a photoresist pattern defining an opening by patterning the photoresist film; and
   reducing the size of the opening by performing a first thermal flow process on the photoresist pattern.

2. The method of claim 1, wherein the photoresist pattern is formed by exposing the photoresist film using a half tone phase shift mask.

3. The method of claim 1, wherein the thermal flow process comprises heating at a temperature higher than either the glass transition temperature or the softening temperature of the polymer mixture I or the polymer mixture II.

4. The method of claim 1, further comprising, after the first thermal flow process:
   cooling the semiconductor substrate; and
   further reducing the size of the opening by performing a second thermal flow process on the photoresist pattern.

5. The method of claim 4, wherein the second thermal flow process is performed at a temperature higher than the temperature of the first thermal flow process.

6. The method of claim 5, wherein the second thermal flow process is performed at a temperature 10° C. to 30° C. higher than the temperature of the first thermal flow process.

7. The method of claim 4, further comprising, after the second thermal flow process:
   cooling the semiconductor substrate; and
   further reducing the size of the opening by performing a third thermal flow process on the photoresist pattern at a temperature 2° C. to 10° C. higher than the temperature of the second thermal flow process.

8. The method of claim 1, wherein the acid-labile di-alkyl malonate group is a di-t-butyl malonate or di-tetrahydropyranyl malonate.

9. The method of claim 1, wherein the group that thermally decomposes at a temperature lower than the glass transition temperature of the polymer B itself is selected from the group consisting of a t-butoxycarbonyloxy, tetrahydropyranyloxy, and $C_1$ to $C_{10}$ alkoxy-1-ethoxy.

10. The method of claim 1, wherein polymer mixture I is used, and polymer A and polymer B are present in a weight ratio of from 1:9 to 5:5.

11. The method of claim 1, wherein polymer mixture II is used, and polymer B and polymer C are present in a weight ratio of from 5:5 to 9:1.

12. The method of claim 1, wherein the photosensitive acid generator is present at from 1 to 15 weight percent based on the total weight of the polymer mixture I or II.

13. The method of claim 1, wherein the photosensitive acid generator is selected from the group consisting of triarylsulfonium salts, diaryl iodonium salts, and sulfonates.

14. The method of claim 1, wherein the photoresist composition further comprises an organic base in an amount ranging from 0.01 to 2.0 weight percent based on the total weight of the polymer mixture I or II.

15. The method of claim 14, wherein the organic base is selected from the group consisting of triethylamine, triisobutylamine, diethanolamine, and triethanolamine.

16. The method of claim 1, wherein the polymer A is represented by the following chemical formula 1, the polymer B is represented by the following chemical formula 2, and each polymer has a weight average molecular weight ranging from 5,000 to 100,000:

CHEMICAL FORMULA 1

CHEMICAL FORMULA 2 wherein: $R_1$ is selected from the group consisting of t-butyl and tetrahydropyranyl; and $R_2$ and $R_3$ are each a hydrogen atom or a methyl group; $R_4$ is selected from the group consisting of $C_1$ to $C_{10}$ alkoxy-1-ethyl, tetrahydropyranyl, and t-butoxycarbonyl; m, n, x, and y are integers; the ratio of m/(m+n) is from 0.1 to 0.5; and the ratio of y/(x+y) is from 0.1 to 0.5.

17. The method of claim 1, wherein polymer B is represented by the following chemical formula 2, polymer C is represented by the following chemical formula 3, and each polymer has a weight average molecular weight ranging from 5,000 to 100,000:

CHEMICAL FORMULA 2

CHEMICAL FORMULA 3 wherein: $R_4$ is selected from the group consisting of $C_1$ to $C_{10}$ alkoxy-1-ethyl, tetrahydropyranyl, and t-butoxycarbonyl; $R_5$ is a hydrogen atom or a methyl group; $R_6$ is selected from the group consisting of t-butyl and tetrahydropyranyl; and group; x, y, p, and q are integers; the ratio of y/(x+y) is from 0.1 to 0.5; and the ratio of q/(q+p) is from 0.1 to 0.5.

18. The method of claim 16, wherein the first thermal flow process is performed at a temperature higher than either the glass transition temperature or the softening temperature of the polymer mixture I or II.

19. The method of claim 16, further comprising, before etching the material film:
   cooling the semiconductor substrate; and
   further reducing the size of the opening by performing a second thermal flow process on the photoresist pattern.

20. A semiconductor device prepared by the method of claim 16.

21. A method for manufacturing a semiconductor device, comprising:
   providing a semiconductor substrate;
   forming a material film to be patterned on the semiconductor substrate;
   forming a photoresist film on the material film by coating thereon a photoresist composition comprising: (i) either a polymer mixture I containing a polymer A in which an acid-labile di-alkyl malonate group is pendant to the polymer backbone and a polymer B in which a group that thermally decomposes at a temperature lower than the glass transition temperature of the polymer B itself is pendant to the polymer backbone, or a polymer mixture II containing the polymer B and a polymer C including (meth)acrylate as a monomer; and (ii) a photosensitive acid generator;
   forming a photoresist pattern defining an opening by patterning the photoresist film;
   reducing the size of the opening by performing a first thermal flow process on the photoresist pattern; and
   etching the material film using the photoresist pattern as a mask to form either a contact hole or a damascene area in the material film, whereby the contact hole or the damascene area have the reduced size of the opening in the photoresist film.

* * * * *